(12) United States Patent
Lee et al.

(10) Patent No.: US 9,093,686 B2
(45) Date of Patent: *Jul. 28, 2015

(54) BATTERY PACK OF COMPACT STRUCTURE

(71) Applicant: LG CHEM, LTD., Seoul (KR)

(72) Inventors: BumHyun Lee, Seoul (KR); Jin Kyu Lee, Daejeon (KR); MinJung Kim, Suwon-si (KR); Jong Moon Yoon, Daejeon (KR); DalMo Kang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/321,513

(22) Filed: Jul. 1, 2014

(65) Prior Publication Data

US 2014/0315057 A1    Oct. 23, 2014

Related U.S. Application Data (63) Continuation of application No. 13/761,365, filed on Feb. 7, 2013, now Pat. No. 8,802,259, which is a continuation of application No. PCT/KR2011/005820, filed on Aug. 10, 2011.

(30) Foreign Application Priority Data

Aug. 16, 2010   (KR) .................. 10-2010-0078627

(51) Int. Cl.
*H01M 2/10*    (2006.01)
*B60L 11/18*   (2006.01)
(Continued)

(52) U.S. Cl.
CPC ......... *H01M 2/1016* (2013.01); *B60L 11/1879* (2013.01); *H01M 2/1077* (2013.01);
(Continued)

(58) Field of Classification Search
None
See application file for complete search history.

(56) References Cited

U.S. PATENT DOCUMENTS 7,955,729 B2    6/2011   Onuki et al.
2006/0177733 A1*  8/2006  Ha et al. .................. 429/159
(Continued)

FOREIGN PATENT DOCUMENTS

CN    101141008 A    3/2008
CN    101488595 A    7/2009
(Continued)

OTHER PUBLICATIONS

English machine translation of WO-2010/008026-A1 dated Jan. 21, 2010.
(Continued)

*Primary Examiner* — Miriam Stagg
*Assistant Examiner* — Carmen Lyles-Irving
(74) *Attorney, Agent, or Firm* — Birch, Stewart, Kolasch & Birch, LLP (57) ABSTRACT

Disclosed herein is a battery pack including a battery module including a cell module stack having a structure in which a plurality of cell modules, each of which includes a battery cell mounted in a cartridge, is vertically stacked, a lower end plate to support a lower end of the cell module stack, an upper end plate to fix an uppermost cartridge of the cell module stack disposed on the lower end plate, and a voltage detection assembly to detect voltages of the battery cells, a box type pack case in which the battery module is mounted, a pack cover coupled to the pack case, and fastening extension members protruding upward from the battery module to couple the battery module to the pack case and the pack cover.

14 Claims, 8 Drawing Sheets

(51) Int. Cl.
*H01M 2/20* (2006.01)
*H01M 2/22* (2006.01)
*H01M 10/60* (2014.01)
*H01M 10/625* (2014.01)
*G01R 31/36* (2006.01)

(52) U.S. Cl.
CPC ............... *H01M2/206* (2013.01); *H01M 2/22* (2013.01); *H01M 10/50* (2013.01); *H01M 10/5016* (2013.01); *H01M 10/60* (2015.04); *H01M 10/625* (2013.01); *G01R 31/362* (2013.01); *H01M 2/10* (2013.01); *H01M 2220/20* (2013.01); *Y02T 10/7005* (2013.01); *Y02T 10/705* (2013.01)

(56) References Cited

U.S. PATENT DOCUMENTS

| | | | |
|---|---|---|---|
| 2006/0246773 | A1* | 11/2006 | Yoon et al. ............... 439/507 |
| 2008/0057392 | A1 | 3/2008 | Takamatsu et al. |
| 2008/0292962 | A1* | 11/2008 | Jung ............... 429/211 |
| 2008/0318119 | A1 | 12/2008 | Watanabe et al. |
| 2010/0136420 | A1 | 6/2010 | Shin et al. |
| 2011/0115437 | A1 | 5/2011 | Kasai |
| 2012/0315522 | A1* | 12/2012 | Shin et al. ............... 429/92 |

FOREIGN PATENT DOCUMENTS

| | | |
|---|---|---|
| EP | 1523051 A2 | 4/2005 |
| JP | 3349349 B2 | 11/2002 |
| JP | 2006-236826 A | 9/2006 |
| JP | 2010-27261 A | 2/2010 |
| KR | 10-2006-0087512 A | 8/2006 |
| KR | 10-2008-0027506 A | 3/2008 |
| WO | WO 2006/043163 A1 | 4/2006 |

OTHER PUBLICATIONS

International Search Report, dated Apr. 4, 2012, issued in PCT/KR2011/005820.

* cited by examiner

BATTERY PACK OF COMPACT STRUCTURE

CROSS-REFERENCE TO RELATED APPLICATIONS

This application is a Continuation of U.S. application Ser. No. 13/761,365 now U.S. Pat. No. 8,802,259 filed on Feb. 7, 2013, which is a Continuation of PCT/KR2011/005820 filed on Aug. 10, 2011, which claims priority under U.S.C. 119(a) to U.S patent aplication Ser. No. 10-2010-0078627 filed in the Republic of Korea on Aug. 16, 2010, all of which are hereby expressly incorporated by reference into the present application.

TECHNICAL FIELD

The present invention relates to a battery pack of a compact structure, and, more particularly, to a battery pack including a battery module including a cell module stack having a structure in which a plurality of cell modules, each of which includes a battery cell mounted in a cartridge, is vertically stacked, a lower end plate to support a lower end of the cell module stack, an upper end plate to fix an uppermost cartridge of the cell module stack disposed on the lower end plate, and a voltage detection assembly to detect voltages of the battery cells, a box type pack case in which the battery module is mounted, a pack cover coupled to the pack case, and fastening extension members protruding upward from the battery module to couple the battery module to the pack case and the pack cover.

BACKGROUND ART

Recently, a secondary battery, which can be charged and discharged, has been widely used as an energy source for wireless mobile devices. Also, the secondary battery has attracted considerable attention as a power source for electric vehicles (EV), hybrid electric vehicles (HEV), and plug-in hybrid electric vehicles (Plug-In HEV), which have been developed to solve problems, such as air pollution, caused by existing gasoline and diesel vehicles using fossil fuels.

Small-sized mobile devices use one or several battery cells for each device. On the other hand, middle or large-sized devices, such as vehicles, uses a middle or large-sized battery module having a plurality of battery cells electrically connected to one another because high power and large capacity are necessary for the middle or large-sized devices.

Preferably, the battery module is manufactured so as to have as small a size and weight as possible. For this reason, a prismatic battery or a pouch-shaped battery, which can be stacked with high integration and has a small weight to capacity ratio, is usually used as a battery cell of the middle or large-sized battery module. In particular, much interest is currently focused on the pouch-shaped battery, which uses an aluminum laminate sheet as a sheathing member, because the pouch-shaped battery is lightweight, and the manufacturing costs of the pouch-shaped battery are low.

Also, the secondary battery is used as a power source for vehicles or as an emergency power source for relay stations of telecommunication corporations as a result of extension of the application range of the secondary battery. Consequently, fastening means to maintain a compact and stable coupling state of a module case are needed.

However, in a case in which the battery module is constructed using a plurality of battery cells or a plurality of cell modules, each of which includes a predetermined number of battery cells, a plurality of members for mechanical fastening and electrical connection therebetween is generally needed with the result that a process of assembling the mechanical fastening and electrical connection members is very complicated. Furthermore, there is needed a space for coupling, welding, or soldering of the mechanical fastening members with the result that the total size of the battery system is increased.

Meanwhile, a large amount of heat is generated from such a high-power, large-capacity secondary battery during the charge and discharge of the battery. If the heat, generated from a battery module during the charge and discharge of the battery module, is not effectively removed from the battery module, the heat accumulates in the battery module with the result that deterioration of the battery module is accelerated. According to circumstances, the battery module may catch fire or explode. For this reason, a battery pack of high power and large capacity needs a cooling system to cool battery cells mounted in the battery pack.

Each battery module mounted in a middle or large-sized battery pack is generally manufactured by stacking a plurality of battery cells with high integration. In this case, the battery cells are stacked in a state in which the battery cells are arranged at predetermined intervals such that heat generated during the charge and discharge of the battery cells is removed. For example, the battery cells may be sequentially stacked in a state in which the battery cells are arranged at predetermined intervals without using an additional member. Alternatively, in a case in which the battery cells have low mechanical strength, one or more battery cells are mounted in a cartridge, and a plurality of cartridges is stacked to constitute a battery module. Coolant channels are defined between the stacked battery cells or between the stacked battery modules so that heat accumulated between the stacked battery cells or between the stacked battery modules is effectively removed.

In this structure, however, it is necessary to provide a plurality of coolant channels corresponding to the number of the battery cells with the result that the overall size of the battery module is increased.

Also, intervals between the coolant channels are relatively narrowed as a plurality of battery cells is stacked in consideration of the size of the battery module. As a result, design of the cooling structure is complicated. That is, high pressure loss is caused by the coolant channels arranged at intervals narrower than a coolant inlet port with the result that it is difficult to design shapes and positions of the coolant inlet port and a coolant outlet port. Also, a fan may be further provided to prevent such pressure loss. In this case, design may be restricted due to power consumption, fan noise, space or the like.

The increase in size of the battery module and the complexity in structure of the battery module are not preferable in the above regard. Consequently, there is a high necessity for a battery module which is compact, has a fastening structure of excellent stability, and exhibits high cooling efficiency.

DISCLOSURE

Technical Problem

Therefore, the present invention has been made to solve the above problems and other technical problems that have yet to be resolved.

Specifically, it is an object of the present invention to provide a battery pack that can be manufactured using a simple assembly method without using a plurality of members for mechanical fastening.

It is another object of the present invention to provide a battery pack wherein a high heat dissipation effect of the battery pack is achieved by a pack case having a specific structure, and therefore, cooling efficiency of the battery pack is maximized while the total size of the battery pack is minimized.

Technical Solution

In accordance with one aspect of the present invention, the above and other objects can be accomplished by the provision of a battery pack including a battery module including a cell module stack having a structure in which a plurality of cell modules, each of which includes a battery cell mounted in a cartridge, is vertically stacked, a lower end plate to support a lower end of the cell module stack, an upper end plate to fix an uppermost cartridge of the cell module stack disposed on the lower end plate, and a voltage detection assembly to detect voltages of the battery cells, a box type pack case in which the battery module is mounted, a pack cover coupled to the pack case, and fastening extension members protruding upward from the battery module to couple the battery module to the pack case and the pack cover.

That is, the battery pack according to the present invention is configured to have a structure in which the battery module including the cell module stack fixed between the upper end plate and the lower end plate is mounted in the pack case and is then covered with the pack cover, thereby simultaneously achieving fastening among the pack case, the pack cover, and the fastening extension members.

Consequently, the assembly efficiency of the battery pack is improved, and the total size of the battery module is reduced, thereby achieving a compact and stable battery pack structure, as compared with the conventional fastening structure requiring a plurality of members to fasten the battery module to the battery pack and welding for coupling therebetween.

Preferably, each of the upper and lower end plates is configured in a rectangular shape having a hollow structure on a plane to improve structural stability and thermal conductivity of the cell module stack. More preferably, each of the upper and lower end plates is made of a metallic material.

Also, a heat insulating member to prevent introduction of radiant heat into the battery cells is preferably mounted to the upper end of the hollow structure. The heat insulating member may be formed of a porous polymer resin, such as Styrofoam.

The fastening structures between the upper end plate and the lower end plate may be formed at various positions of the upper end plate and the lower end plate based on the design structures of the upper end plate and the lower end plate. For example, the upper end plate and the lower end plate may be formed to have a structure in which through holes, through which fixing members to fix the cell module stack are inserted, are formed in four corners of each of the upper and lower end plates. In this structure, structural stability of each of the upper and lower end plates is improved.

Particularly in a case in which the battery module is configured to have an approximately rectangular parallelepiped structure, the structure in which the fixing members are formed in the four corners of each of the upper and lower end plates as described above safely protects the cell module stack disposed between the upper end plate and the lower end plate and further improves fastening strength between the pack case and the pack cover.

In a preferred example, a controller may be disposed between the upper end plate and the pack cover. The controller may be, for example, a battery management system (BMS).

Each of the battery cells may be a lightweight pouch-shaped battery having an electrode assembly mounted in a case formed of a laminate sheet including a thermally welded inner resin layer, a blocking metal layer, and a durable external resin layer.

Meanwhile, the voltage detection assembly may include (a) a block case, formed of an electrically insulative material, mounted to a front or rear of the battery module corresponding to electrode terminal connection parts of the battery cells, (b) conductive sensing parts connected to voltage detection terminals located at one-side ends of bus bars electrically connected to the electrode terminal connection parts of the battery cells, and (c) a connector to transmit voltages detected by the conductive sensing parts to a controller. The block case may include mounting grooves, opened to a front, formed at positions of the block case corresponding to the voltage detection terminals of the bus bars such that the conductive sensing parts are mounted in the mounting grooves, and the conductive sensing parts may be connected to the voltage detection terminals of the bus bars in a state in which the conductive sensing parts are mounted in the mounting grooves of the block case.

The voltage detection assembly is configured to have a structure in which the conductive sensing parts are connected to the voltage detection terminals of the bus bars in a state in which the conductive sensing parts are mounted in the mounting grooves of the block case. Consequently, the assembly process of the voltage detection assembly is simplified, and the voltage detection assembly has a structure that is compact and is capable of stably detecting voltages.

In the above structure, each of the conductive sensing parts may be configured to have a receptacle type structure in which each of the conductive sensing parts is inserted into a corresponding one of the voltage detection terminals of the bus bars from the front of each of the voltage detection terminals, and therefore, it is possible to easily assemble the conductive sensing parts. Also, electrical connection between the conductive sensing parts and the voltage detection terminals is stably maintained even when external impact is applied.

Each of the bus bars may include a plate-shaped body electrically connected to an electrode terminal connection part of each of the battery cells and a voltage detection terminal formed at one end of the plate-shaped body.

Also, each of the bus bars may protrude to the front, thereby easily achieving coupling between the bus bars and the block case.

Meanwhile, contact regions of the pack case and the pack cover may be assembled in an overlapping fashion, and coupling holes may be formed in the overlap regions. In the structure the pack case and the pack cover are assembly in the overlapping fashion as described above, it is possible to prevent the pack cover from being separated from the pack case, thereby further improving coupling between the pack case and the pack cover.

Specifically, coupling holes corresponding to the coupling holes formed in the overlap regions may be formed in the fastening extension members, and, in a state in which the battery module, the pack case, and the pack cover are disposed such that the coupling holes communicate with each other, fastening members may be inserted through the coupling holes to achieve coupling therebetween.

That is, the coupling holes are formed in corresponding positions of the pack case and the pack cover, and the fastening members are inserted through the coupling holes formed in the corresponding positions of the pack case and the pack cover, thereby reducing the number of assembly processes and thus improving manufacturing efficiency.

In particular, the heights of the coupling holes of the fastening extension members may be equal to those of the coupling holes of the pack case in a state in which the battery module is mounted in the pack case. Consequently, it is possible to more easily perform fastening between coupling holes through assembly, thereby achieving stable coupling between the battery module and the pack case.

The fastening members are not particularly restricted so long as the fastening members easily achieves fastening between the battery module and the pack case. For example, the fastening members may be fastening screws or bolts. Coupling among the pack case, the pack cover, and the battery module is more securely achieved by the fastening members.

Meanwhile, in the battery pack according to the present invention, the pack case may be provided with a plurality of intake ports at a position corresponding to the cell modules to achieve a cooling effect using surrounding air without the provision of additional heat dissipation members.

Specifically, each of the intake ports may be formed in the shape of a slit corresponding to each of the plate-shaped cell modules, and a plurality of intake ports corresponding to the number of the cell modules may be formed in the pack case. Consequently, air is introduced through the slit-shaped intake ports provided for each cell module in a natural circulation fashion and passes through the battery pack approximately in a straight line, and therefore, cooling efficiency is high while the structure of the battery pack is compact.

Also, each of the intake ports may be configured to have a structure in which an upper part of each of the intake ports is formed in the shape of a skirt to prevent introduction of foreign matter. Consequently, air is introduced into the intake ports in a state in which the air is slightly inclined upward.

The battery pack according to the present invention may be manufactured by combining battery modules based on desired power and capacity. In consideration of installation efficiency and structural stability as previously described, the battery pack according to the present invention is preferably used as a power source for electric vehicles, hybrid electric vehicles, electric motorcycles, or electric bicycles.

Particularly in the battery pack having the above structure, the battery cells are vertically stacked, and the total size of the battery pack is compact. Consequently, the battery pack may be mounted in a relay station of a telecommunication corporation such that the batter pack is used as an uninterruptible power supply (UPS) that supplies power in emergency.

DESCRIPTION OF DRAWINGS

The above and other objects, features and other advantages of the present invention will be more clearly understood from the following detailed description taken in conjunction with the accompanying drawings, in which:

FIG. 6 is a sectional see-through typical view showing the battery pack of

FIG. 5;

BEST MODE

Now, preferred embodiments of the present invention will be described in detail with reference to the accompanying drawings. It should be noted, however, that the scope of the present invention is not limited by the illustrated embodiments.

Figure 1:
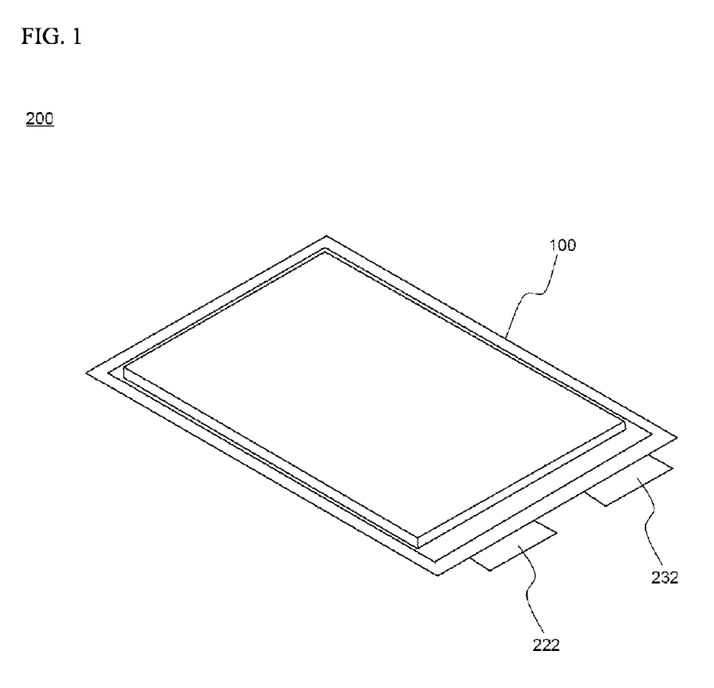
FIG. 1 is a perspective view showing a battery cell mounted in a battery module.
Figure 2:
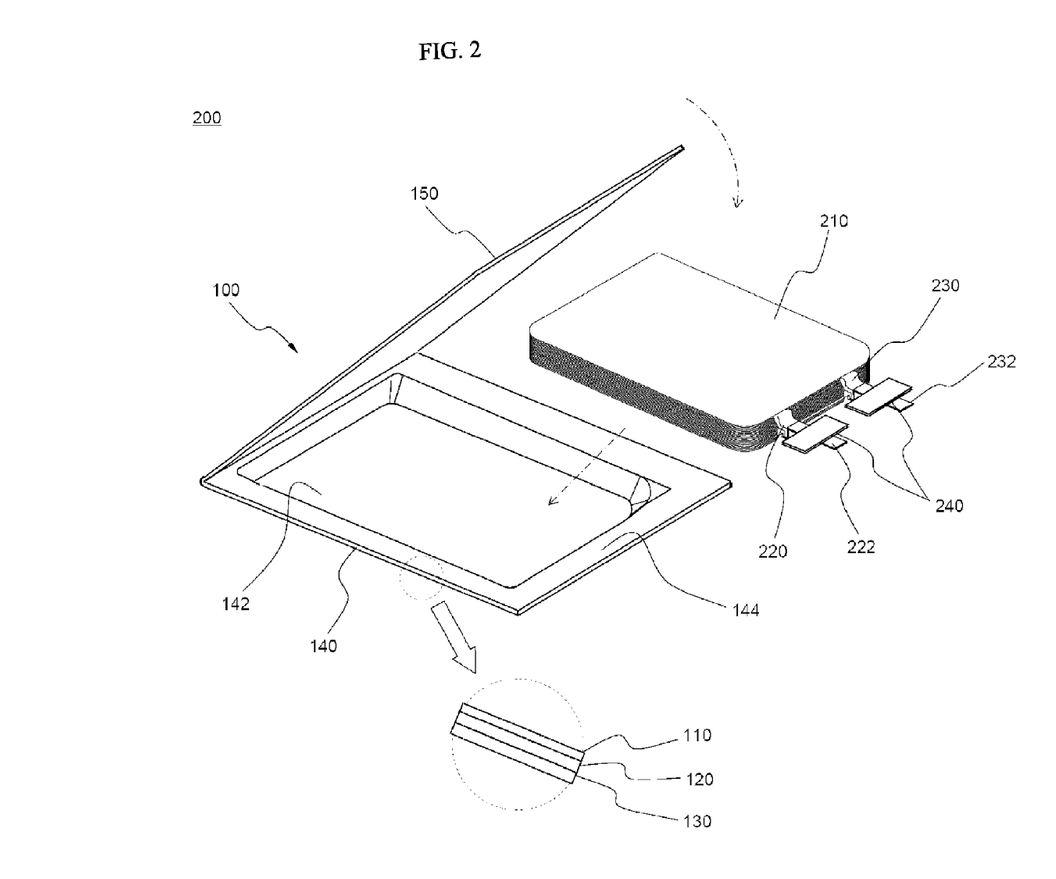
FIG. 2 is an exploded typical view of FIG. 1.

FIG. 1 is a perspective view typically showing an exemplary battery cell mounted in a unit module according to the present invention, and FIG. 2 is an exploded typical view of FIG. 1.

Referring to these drawings, a pouch-shaped battery cell 200 is configured to have a structure in which an electrode assembly 210, including cathodes, anodes, and separators disposed respectively between the cathodes and the anodes, is mounted in a pouch-shaped battery case 100 in a sealed state such that two electrode terminals 222 and 232 electrically connected to cathode and anode tabs 220 and 230 of the electrode assembly are exposed to the outside.

The battery case 100 includes a case body 140 having a depressed receiving part 142, in which the electrode assembly 210 is located, and a cover 150 integrally connected to the case body 140.

The cathode tabs 220 and the anode tabs 230 of the stacked type or stacked/folded type electrode assembly 210 are respectively coupled to the electrode terminals 222 and 232 by welding. Also, insulative films 240 are attached to the top and bottom of each of the electrode terminals 222 and 232 to prevent the occurrence of a short circuit between a thermal welding device and electrode terminals 222 and 232 and to achieve sealing between the electrode terminals 222 and 232 and the battery case 100 when a surplus part 144 of the case body 140 and the cover 150 are thermally welded to each other using the thermal welding device.

The battery case 140 and the cover 150 include outer resin layers 110, isolation metal layers 120, and inner resin layers 130. The inner resin layers 130 of the battery case 140 and the cover 150 may be tightly fixed to the each other by heat and pressure applied from the thermal welding device (not shown) to the outer surface of the battery case 140 and the outer surface the cover 150.

In a state in which the electrode assembly 210 impregnated with an electrolyte is placed in the receiving part 142, contact parts between the surplus part 144 of the case body 140 and the cover 150 are thermally welded to form sealed parts.

Figure 3:
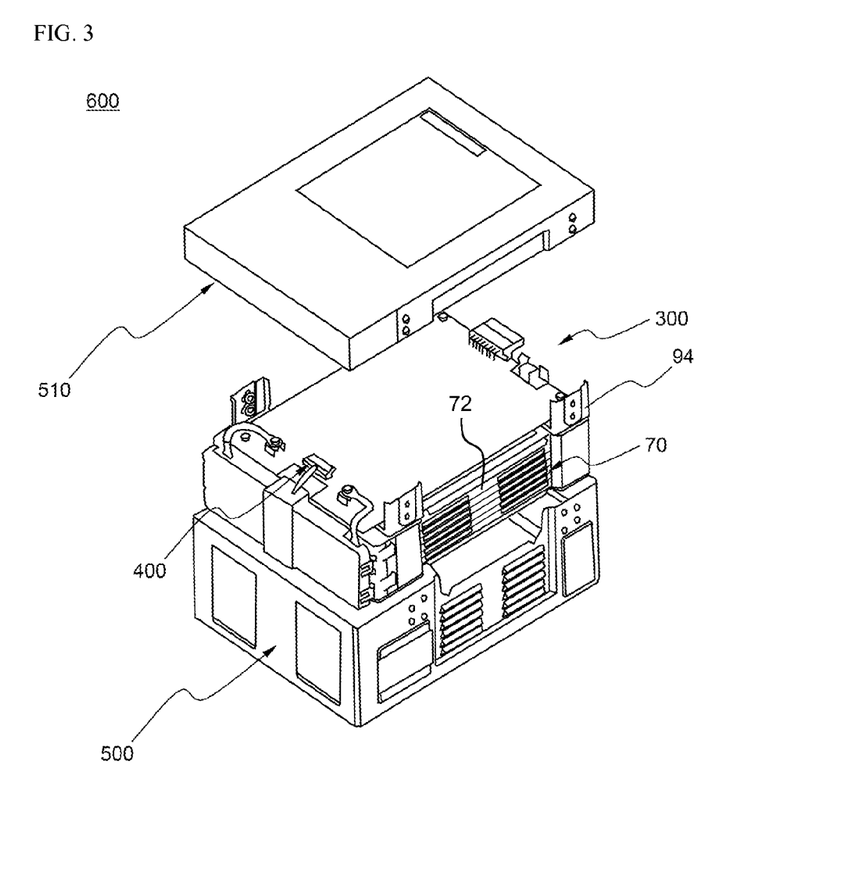
FIG. 3 is an exploded perspective view showing a battery pack according to an embodiment of the present invention.
Figure 4:
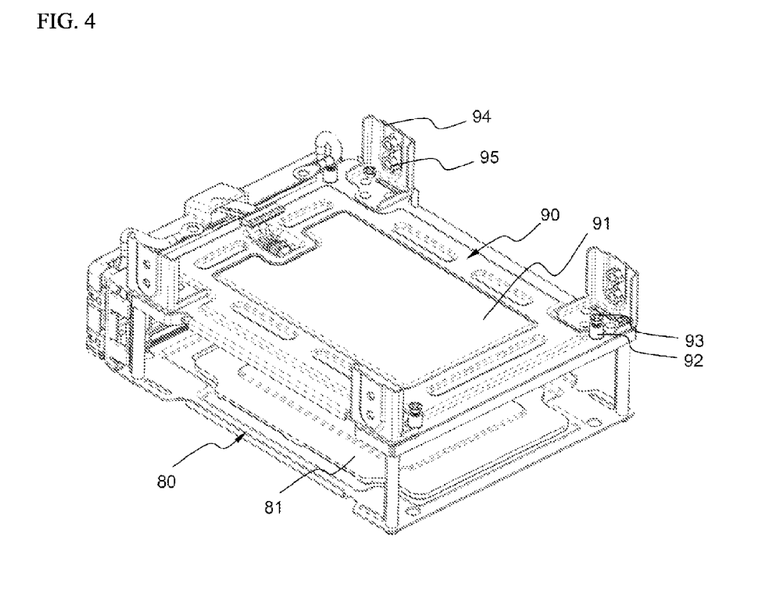
FIG. 4 is a perspective view showing the structure of the battery pack of FIG. 3 excluding a pack cover, a pack case, a cell module stack, and a controller.

FIG. 3 is an exploded perspective view typically showing a battery pack according to an embodiment of the present invention, and FIG. 4 is a perspective view typically showing the structure of the battery pack of FIG. 3 excluding a pack cover, a pack case, a cell module stack, and a controller.

Referring to these drawings, a battery pack 600 includes a battery module 300, a box type pack case 500 in which the battery module 300 is mounted, a pack cover 510 coupled to the pack case 500, and fastening extension members 94 protruding upward from the battery module 300 to couple the battery module 300 to the pack case 500 and the pack cover 510.

The battery module 300 includes a cell module stack 70 having a structure in which a plurality of cell modules, each of which includes a battery cell mounted in a cartridge 72, is vertically stacked, a lower end plate 80 to support the lower end of the cell module stack 70, an upper end plate 90 to fix an uppermost cartridge (not shown) of the cell module stack 70 disposed on the lower end plate 80, and a voltage detection assembly 400.

At the central parts of the upper and lower end plates 90 and 80 are respectively mounted heat insulating members 91 and 81 to prevent introduction of radiant heat into the battery cells.

In addition, the four corners of each of the upper end plate 90 and the lower end plate 80 are connected by supporting bars.

Also, through holes 92, through which fastening members 93 to fix the cell module stack are inserted, are formed in four corners of the upper end plate 90 and the lower end plate 80.

Figure 5:
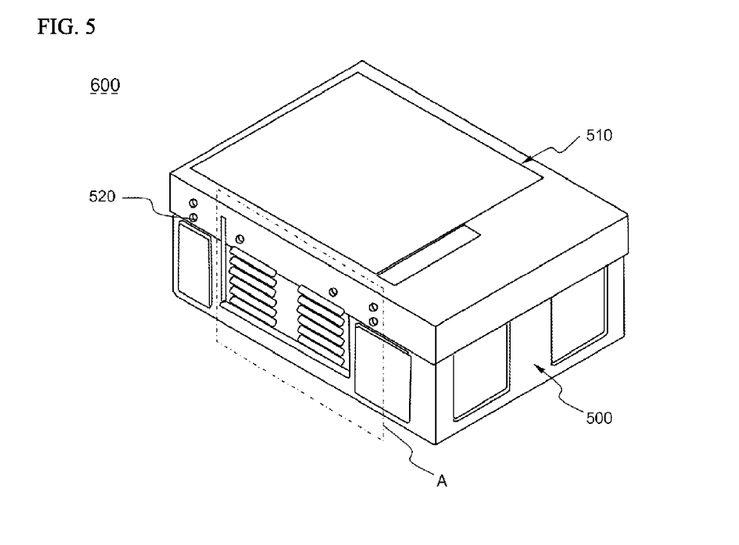
FIG. 5 is a perspective view showing the battery pack of FIG. 3.
Figure 6:
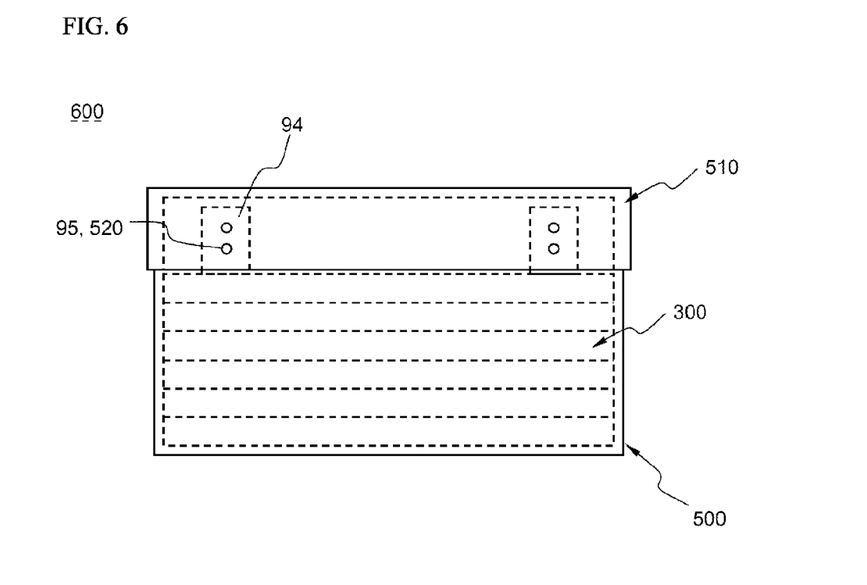

FIG. 5 is a perspective view typically showing the battery pack according to the embodiment of the present invention, and FIG. 6 is a sectional see-through typical view showing the battery pack of FIG. 5.

Referring to these drawings together with FIGS. 3 and 4, contact regions of the pack case 500 and the pack cover 510 are assembled in an overlapping fashion. Coupling holes 520 are formed in the overlap regions.

In the fastening extension members 94 are formed coupling holes 95 corresponding to the coupling holes 520 formed in the overlap regions. In a state in which the battery module 300, the pack case 500, and the pack cover 510 are disposed such that the coupling holes 95 and 520 communicate with each other, fastening members (not shown), such as fastening screws or bolts, are inserted through the coupling holes 95 and 520, thereby achieving coupling therebetween.

Also, the heights of the coupling holes 95 of the fastening extension members 94 are equal to those of the coupling holes 520 of the pack case 500 in a state in which the battery module 300 is mounted in the pack case 500, thereby achieving easy fastening between the coupling holes 95 and 520 and thus achieving stable coupling between the battery module 300 and the pack case 500.

Figure 7:
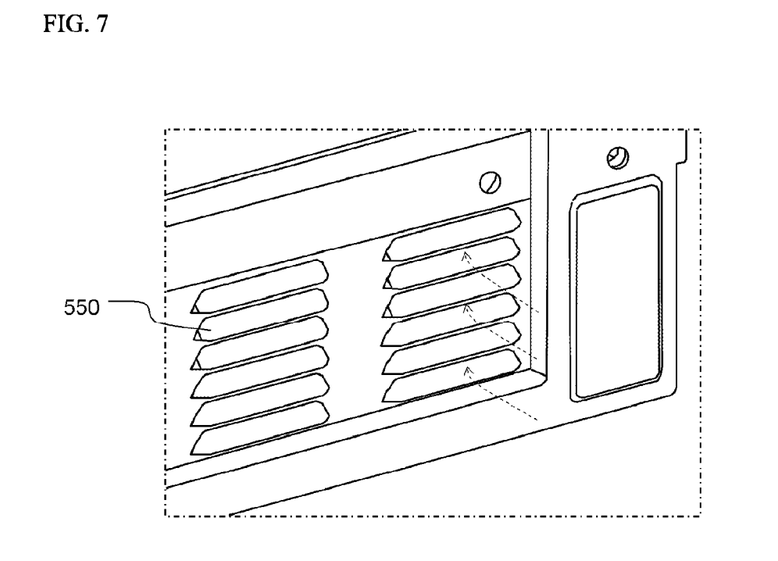
FIG. 7 is an enlarged view showing part A of FIG. 5.

FIG. 7 is an enlarged view typically showing part A of FIG. 5.

Referring to FIG. 7 together with FIG. 5, the pack case 500 is provided with a plurality of intake ports 550 at a position corresponding to the cell modules 70.

Each of the intake ports 550 is formed in the shape of a slit corresponding to each of the plate-shaped cell modules 70. That is, a plurality of intake ports 550 corresponding to the number of the cell modules 70 is formed in the pack case 500. Consequently, air is introduced through the intake ports 550 provided for each battery cell and passes through the battery pack in a straight line, and therefore, cooling efficiency is high.

Also, each of the intake ports 550 is configured to have a structure in which the upper part of each of the intake ports 550 is formed in the shape of a skirt to prevent introduction of foreign matter. Consequently, air is introduced into the intake ports 550 in a state in which the air is slightly inclined upward in directions indicated by arrows in FIG. 7.

Figure 8:
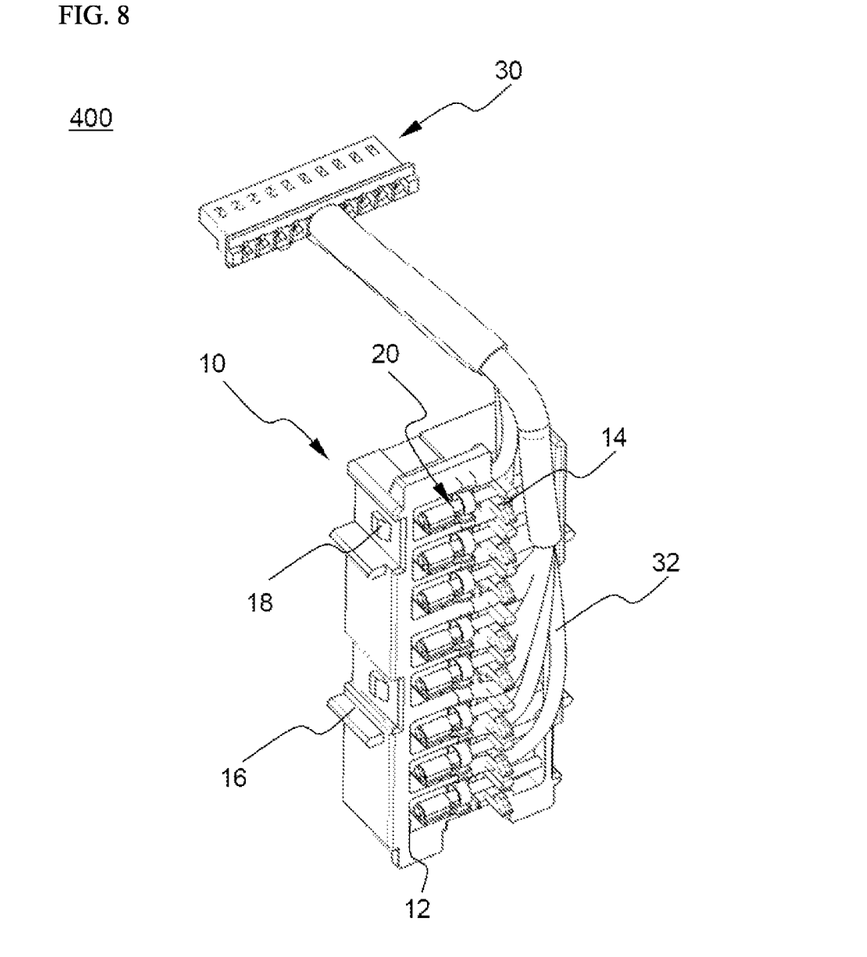
FIG. 8 is a perspective view showing a voltage detection assembly according to an embodiment of the present invention.
Figure 9:
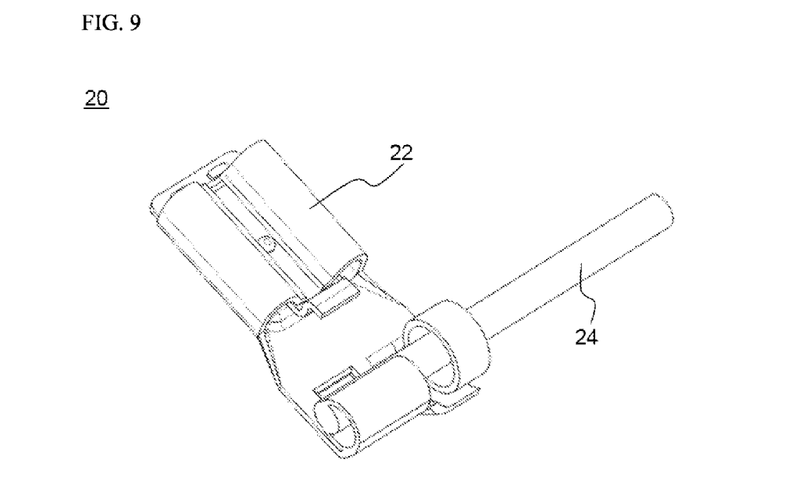
FIG. 9 is a perspective view showing a conductive sensing part of FIG. 8.

FIG. 8 is a perspective view typically showing a voltage detection assembly according to an embodiment of the present invention, and FIG. 9 is a perspective view typically showing a conductive sensing part of FIG. 8.

Figure 11:
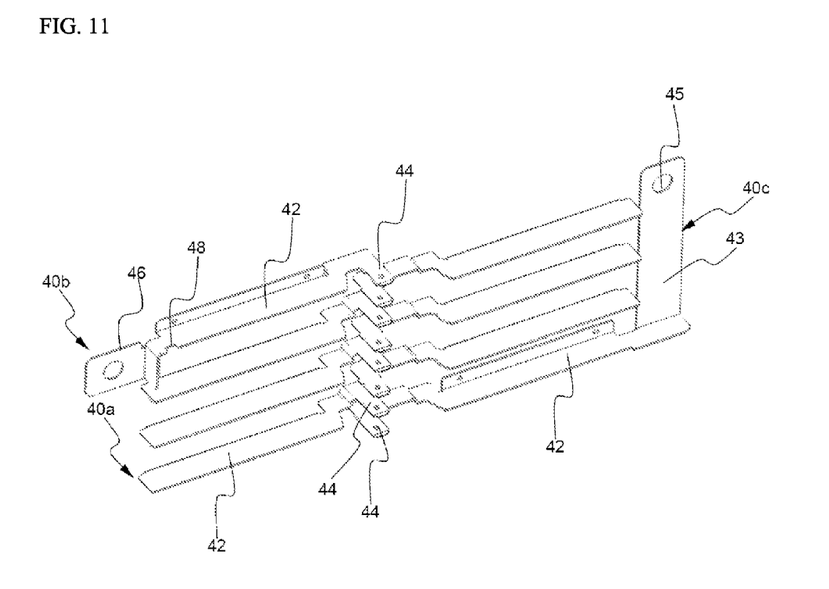
FIG. 11 is a perspective view showing bus bars mounted to the insulative mounting member of FIG. 10.

Referring to these drawings together with FIGS. 3 and 11, the voltage detection assembly 400 includes a block case 10 mounted to the front of the battery module 300 corresponding to electrode terminal connection parts of the battery cells, conductive sensing parts 20 connected to the voltage detection terminals 44 located at one-side ends of the bus bars 40a electrically connected to the electrode terminal connection parts (not shown) of the battery cells, and a connector 30 to transmit voltages detected by the conductive sensing parts 20 to the controller.

The block case 10 includes mounting grooves 12, opened to the front, formed at positions of the block case 10 corresponding to the voltage detection terminals 44 of the bus bars 40a such that the conductive sensing parts 20 are mounted in the mounting grooves 12. The conductive sensing parts 20 are connected to the voltage detection terminals 44 of the bus bars 40a in a state in which the conductive sensing parts 20 are mounted in the mounting grooves 12 of the block case 10.

Also, the mounting grooves 12 of the block case 10 are individually formed for each conductive sensing part 20. Each of the conductive sensing parts 20 is configured to have a receptacle type structure in which each of the conductive sensing parts 20 is inserted into a corresponding one of the voltage detection terminals 44 of the bus bars 40a from the front of each of the voltage detection terminals 44.

Specifically, each of the conductive sensing parts 20 includes a receptacle part 22 inserted into a corresponding one of the voltage detection terminals 44 of the bus bars 40a and a conduction wire 24. The receptacle part 22 is connected to the conduction wire 24 in a state in which the receptacle part 22 is perpendicular to the conduction wire 24.

The conductive sensing parts 20 are connected to the connector via their wires 24. The wires 24 are wrapped with insulation tapes 32 to insulate the wires 24 from the outside.

Also, clamp-shaped fastening members 14 to stably fix the wires 24 protrude forward from the front of the block case 10.

Figure 10:
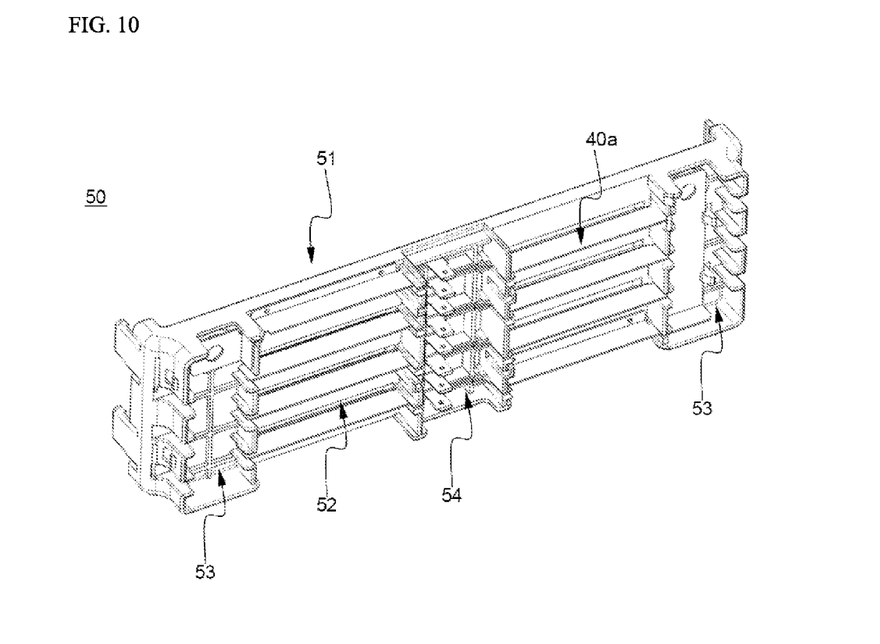
FIG. 10 is a perspective view showing an insulative mounting member in which the voltage detection assembly of FIG. 8 is mounted.

The block case 10 is provided at opposite ends thereof with fastening protrusions 16, which protrude outward so as to be coupled into slits of the insulative mounting member 50. Above the fastening protrusions 16 are provided sliding protrusions 18, which protrude outward so as to be fastened into the inside of a voltage detection assembly location part 54 of the insulative mounting member 50 in a sliding fashion.

FIG. 10 is a perspective view typically showing the insulative mounting member in which the voltage detection assembly of FIG. 8 is mounted, and FIG. 11 is a perspective view typically showing the bus bars mounted to the insulative mounting member of FIG. 10.

Referring to these drawings together with FIG. 3, each of the bus bars 40a includes a plate-shaped body 42 electrically connected to an electrode terminal connection part of a battery cell and a voltage detection terminal 44 formed at one end of the plate-shaped body 42.

Of the bus bars, the bus bar 40b connected to a cathode external input and output terminal further includes a first external input and output terminal connection part 46 formed at the other end of the plate-shaped body 42 opposite to the voltage detection terminal 44 and bent so as to protrude outward from the body 42.

Between the body 42 and the first external input and output terminal connection part 46 is formed a narrow depression 48 having a vertical sectional area equivalent to 40% that of the body 42 to cause a short circuit in an overcurrent state.

Of the bus bars, the bus bar 40c connected to an anode external input and output terminal further includes a second external input and output terminal connection part 43 formed at the other end of the plate-shaped body 42 opposite to the voltage detection terminal 44 and bent so as to protrude outward and upward from the body 42.

In the first external input and output terminal connection part 46 and the second external input and output terminal connection part 43 are formed fastening holes 45, into which the external input and output terminals are coupled.

The insulative mounting member 50 is configured to have a rectangular parallelepiped structure having the size corresponding to the front of the cell module stack 70. At the rear of the insulative mounting member 50 are formed cartridge coupling grooves 51 into which the front ends of the cartridges are inserted and coupled. At opposite sides of the front of the insulative mounting member 50 are formed electrode terminal through holes 52, through which the electrode terminal connection parts of the battery cells are introduced from the rear of the insulative mounting member 50 such that the electrode terminal connection parts of the battery cells are exposed.

Also, location parts 53 for the external input and output terminal connection parts are formed at opposite ends of the front of the insulative mounting member 50 such that the external input and output terminal connection parts 46 and 43 of the bus bars 40a, 40b, and 40c are stably mounted in the location parts 53. In addition, the voltage detection assembly location part 54 is formed at the central region of the insulative mounting member 50 such that the voltage detection assembly 400 is stably mounted in the voltage detection assembly location part 54.

Fastening depressions are formed at the location parts 53 for the external input and output terminal connection parts, and the electrode terminal connection parts (not shown) of the battery cells exposed forward through the electrode terminal through holes 52 are electrically connected to the upper end surfaces of the bus bars 40a mounted in the electrode terminal through holes 52.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

[Industrial Applicability]

As is apparent from the above description, a battery pack according to the present invention can be manufactured using a simple assembly method without using a plurality of members for mechanical fastening, and therefore, it is possible to reduce manufacturing costs of the battery pack and to improve manufacturing efficiency of the battery pack.

Also, the battery pack according to the present invention includes intake ports, and therefore, it is possible to maximize cooling efficiency of the battery pack while minimizing the total size of the battery pack.

The invention claimed is:

1. A battery pack comprising:
 a battery module comprising a cell module stack having a structure in which a plurality of cell modules, each of which comprises a battery cell mounted in a cartridge, is vertically stacked, a lower end plate to support a lower end of the cell module stack, an upper end plate to fix an uppermost cartridge of the cell module stack disposed on the lower end plate, and a voltage detection assembly to detect voltages of the battery cells;
 a box type pack case in which the battery module is mounted;
 a pack cover coupled to the pack case; and
 fastening extension members protruding upward from the battery module to couple the battery module to the pack case and the pack cover,
 wherein each of the upper and lower end plates is configured in a rectangular shape having a hollow structure on a plane,
 wherein a heat insulating member is mounted to an upper end of the hollow structure,
 wherein through holes, through which fixing members to fix the cell module stack are inserted, are formed in four corners of each of the upper and lower end plates, and
 wherein the four corners of the upper and lower end plates are connected by supporting bars.

2. The battery pack according to claim 1, further comprising a controller disposed between the upper end plate and the pack cover.

3. The battery pack according to claim 1, wherein each of the battery cells is a pouch-shaped battery cell having an electrode assembly mounted in a case formed of a laminate sheet comprising a resin layer and a metal layer.

4. The battery pack according to claim 1, wherein the voltage detection assembly comprises:
 (a) a block case, formed of an electrically insulative material, mounted to a front or rear of the battery module corresponding to electrode terminal connection parts of the battery cells;
 (b) conductive sensing parts connected to voltage detection terminals located at one-side ends of bus bars electrically connected to the electrode terminal connection parts of the battery cells; and
 (c) a connector to transmit voltages detected by the conductive sensing parts to a controller, and wherein
 the block case comprises mounting grooves, opened to a front, formed at positions of the block case corresponding to the voltage detection terminals of the bus bars such that the conductive sensing parts are mounted in the mounting grooves, and
 the conductive sensing parts are connected to the voltage detection terminals of the bus bars in a state in which the conductive sensing parts are mounted in the mounting grooves of the block case.

5. The battery pack according to claim 4, wherein each of the conductive sensing parts is configured to have a receptacle type structure in which each of the conductive sensing parts is inserted into a corresponding one of the voltage detection terminals of the bus bars from a front of each of the voltage detection terminals.

6. The battery pack according to claim 4, wherein each of the bus bars comprises a plate-shaped body electrically connected to an electrode terminal connection part of each of the battery cells and a voltage detection terminal formed at one end of the plate-shaped body.

7. The battery pack according to claim 1, wherein contact regions of the pack case and the pack cover are assembled in an overlapping fashion, and coupling holes are formed in the overlap regions.

8. The battery pack according to claim 7, wherein coupling holes corresponding to the coupling holes formed in the overlap regions are formed in the fastening extension members, and, in a state in which the battery module, the pack case, and the pack cover are disposed such that the coupling holes communicate with each other, fastening members are inserted through the coupling holes to achieve coupling therebetween.

9. The battery pack according to claim 8, wherein heights of the coupling holes of the fastening extension members are equal to those of the coupling holes of the pack case in a state in which the battery module is mounted in the pack case.

10. The battery pack according to claim 8, wherein the fastening members are fastening screws or bolts.

11. The battery pack according to claim 1, wherein the pack case is provided with a plurality of intake ports at a position corresponding to the cell modules.

12. The battery pack according to claim 11, wherein each of the intake ports is formed in the shape of a slit corresponding to each of the plate-shaped cell modules, and a plurality of intake ports corresponding to the number of the cell modules is formed in the pack case.

13. The battery pack according to claim 12, wherein each of the intake ports is configured to have a structure in which an upper part of each of the intake ports is formed in the shape of a skirt to prevent introduction of foreign matter.

14. The battery pack according to claim 1, wherein the battery pack is used as a power source for electric vehicles, hybrid electric vehicles, electric motorcycles, electric bicycles, or relay stations of communication corporations.

\* \* \* \* \*